United States Patent [19]

Nelson et al.

[11] 4,198,686
[45] Apr. 15, 1980

[54] COUNTER FOR CROSS-TIE WALL MEMORY SYSTEM

[75] Inventors: George F. Nelson, Coon Rapids; Gregory J. Cosimini, St. Paul; Leslie H. Johnson, Minneapolis; David S. Lo, Burnsville; Maynard C. Paul, Bloomington; Ernest J. Torok, Minneapolis, all of Minn.

[73] Assignee: Sperry Corporation, New York, N.Y.

[21] Appl. No.: 20,764

[22] Filed: Feb. 23, 1979

[51] Int. Cl.² .............................................. G11C 19/08
[52] U.S. Cl. .................................. 365/79; 365/87; 365/158; 365/172
[58] Field of Search ................... 365/12, 79, 87, 158, 365/171, 172, 8

[56] References Cited
U.S. PATENT DOCUMENTS
4,080,591  3/1978  Torok .................................. 365/87

Primary Examiner—James W. Moffitt
Attorney, Agent, or Firm—Kenneth T. Grace; William E. Cleaver; Marshall A. Truex

[57] ABSTRACT

A method of and an apparatus for counting is disclosed. The counter includes a generator of cross-tie, Bloch-line pairs and a shift register of N stages or memory cells along which the cross-tie, Bloch-line pairs are propagated or replicated into a detector. The method includes coupling a series of bipolar push-nucleate replicate signals, each one of which produces a cross-tie, Bloch-line pair in the adjacent downstream memory cell along the shift register. When the shift register is filled, a cross-tie will appear in the detector. This provides an output signal indicating that the N memory cells have been filled by the N replicate signals.

4 Claims, 10 Drawing Figures

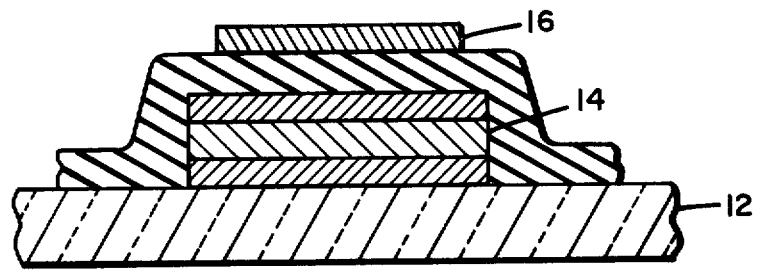
Fig. 2
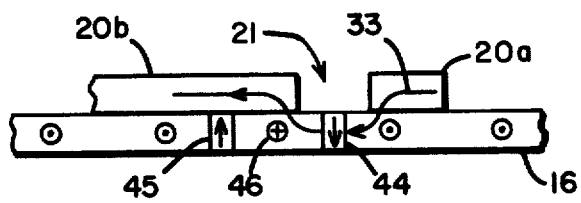
Fig. 3
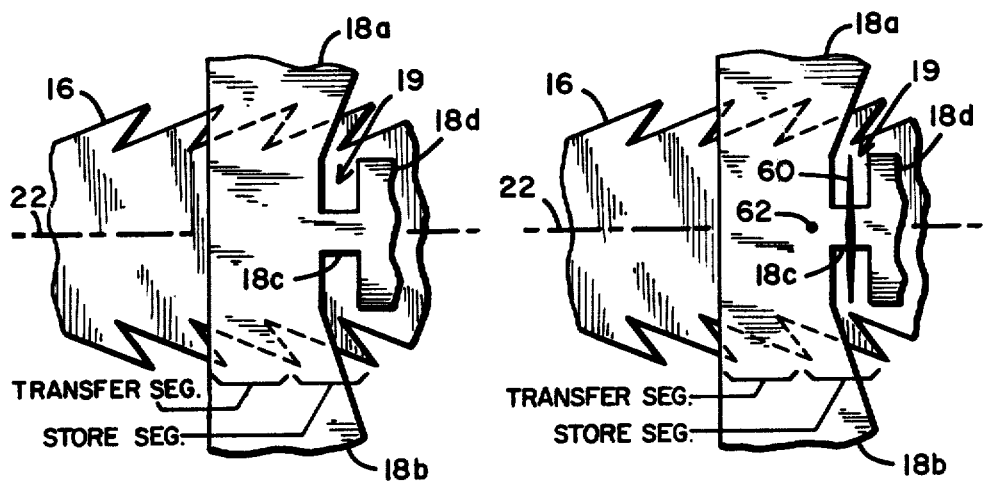
Fig. 5a
Fig. 5b

4,198,686

COUNTER FOR CROSS-TIE WALL MEMORY SYSTEM

The invention described herein was made in the course of, or under, a contract with the Department of the Navy.

BACKGROUND OF THE INVENTION

The propagation of inverted Néel wall sections in a serial access memory system was proposed by L. J. Schwee in the publication "Proposal On Cross-tie Wall and Bloch-line Propagation In Thin Magnetic Films," IEEE Transactions on Magnetics, MAG 8, No. 3, pages 405–407, September, 1972. Such a memory system utilizes a ferromagnetic film of 81% Ni–19% Fe approximately 350 Angstroms (Å) thick in which cross-tie walls can be changed to Néel walls and Néel walls can be changed to cross-tie walls by applying appropriate fields. Associated with the cross-tie walls is a section of inverted Néel wall that is bounded by a cross-tie on one end and a Bloch-line on the other end.

In such a cross-tie wall memory system, information is entered at one end of the serial access memory system by the generation of an inverted Néel wall section, bounded by a cross-tie on one side and a Bloch-line on the other, that is representative of a stored binary 1 or of a non-inverted Néel wall section (i.e., the absence of a cross-tie and Bloch-line pair) that is representative of a stored binary O. Such information is moved or propagated along the cross-tie wall by the successive generation (and then the selective annihilation) of inverted Néel wall sections at successive memory cells along the cross-tie wall. In the D. S. Lo, et al, U.S. Pat. No. 3,906,466 there is disclosed a propagation circuit for the transfer of inverted Néel wall sections at successive memory cells along the cross-tie wall. In the L. J. Schwee U.S. Pat. No. 3,868,660; in the publication "Cross-tie Memories Simplified by the Use of Serrated Strips," L.J. Schwee, et al, AIP Conference Proceedings, No. 29, 21st Annual Conference on Magnetism and Magnetic Materials, 1975, published April, 1976, pages 624-625, and in the publication "Cross-Tie/ Bloch-Line Detection," G. J. Cosimini, et al, AIP Conference Proceedings, No. 3, 23rd Annual Conference on Magnetism and Magnetic Materials, 1978, published March, 1978, pages 1828–1830, there have been published some more recent results of the further development of cross-tie wall memory systems.

In the prior art cross-tie wall memory systems, the magnetic film that functions as the storage medium has the property of uniaxial anisotropy provided by its easy axis induced magnetic fields, which easy axis is generated in the magnetic film during its formation in the vapor deposition process. This easy axis provides a magnetic field induced anisotropy which constrains the generation of the cross-tie wall along and parallel to the easy axis. In the above L. J. Schwee, et al, AIP publication there are proposed serrated strips of Permalloy film, about 350 Angstroms (Å) in thickness and 10 microns (μm) in width, which serrated strips are etched from a planar layer of the magnetic material so that the strips are aligned along the easy axis of the film. After an external magnetic field is applied normal to the strip length, i.e., transverse the easy axis of the film, the magnetization along the opposing serrated edges rotates back to the nearest direction that is parallel to the edge. This creates two large domains that are separated by a Néel, or cross-tie, wall that is formed along the center line of the strip. Cross-ties are energetically more stable at the necks of the serrated edges while Bloch-lines are energetically more stable in the potential walls between adjacent necks.

This serrated strip configuration, because of the contour of the opposing edges of the strip, provides the means whereby the cross-tie, Bloch-line pairs are structured at predetermined memory sections along the strip. However, because prior art strips have field induced uniaxial anisotropy imparted during deposition, such strips cannot be utilized to permit the use of nonlinear, i.e., curved, data tracks, which curved data tracks are essential to the configuration of cross-tie wall memory systems of large capacity or of digital logic function capabilities. In the L. H. Johnson, et al, U.S. Pat. No. 4,075,612 there is disclosed a design of the edge contour of a film strip of, e.g., NiFe film of approximately 350 Å in thickness and approximately 10 μm in width. The edge contours are mirror images, one of the other, of asymmetrical, repetitive patterns of rounded edge portions. The edge contour of each opposing pair of rounded edge portions is substantially in alignment with the natural contour of the magnetization that is oriented around a Bloch-line, which Bloch-line is positioned along the cross-tie wall that is oriented along the geometric centerline of the film strip. The neck or narrowest point of the edge contour between adjacent rounded edge portions functions to structure the static or rest position of the associated cross-tie of the cross-tie, Bloch-line pair.

In the M. C. Paul, et al, U.S. Pat. No. 4,130,888 there is disclosed a cross-tie wall memory system and in particular a data track therefor that is formed of a strip of magnetic material having substantially zero magnetic field induced anisotropy. The data-track-defining-strip of isotropic material utilizes its shape, i.e., its edge contour induced, anisotropy to constrain the cross-tie wall within the planar contour and along the centerline of the film strip. Accordingly, the cross-tie wall is constrained to follow the path defined by the magnetic film strip which path may be configured into a major loop, or circular data track, configuration for large capacity memory storage.

In the E. J. Torok, U.S. Pat. Nos. 4,030,591 and 4,075,613 there is utilized the data-track-defining-strip of isotropic magnetic film of the hereinabove referenced M. C. Paul, et al, patent to form a replicator of and a logic gate for cross-tie, Bloch-line pairs. The replicator is utilized as a magnetic switch or gate to selectively transfer cross-tie, Bloch-line pairs between merging, overlapping data tracks. This permits the configuration of a plurality of continuous data tracks into a major-loop, minor-loop configuration for a large capacity memory system. The logic gate is utilized as a magnetic switch to selectively perform the logic OR function or the logic AND function upon two merging, overlapping data tracks.

SUMMARY OF THE INVENTION

In the counter of the present invention there is provided a shift register for shifting cross-tie, Bloch-line pairs therealong through a plurality N of memory cells. The shift register is terminated on one end by a cross-tie, Bloch-line pair generator, for generating and then coupling cross-tie, Bloch-line pairs into the shift register, and on the other end by a detector for detecting when a cross-tie, Bloch-line pair has been entered therein by the shift register. The shift register, by specifying the number of memory cells therein, e.g., N, functions as a counter by counting the number of replicate cycles, e.g., N, that are required to propagate a cross-tie, Bloch-line pair from the generator, through the shift register and into the detector.

BRIEF DESCRIPTION OF THE DRAWINGS

FIG. 2 is an illustration of a cross-section of the memory plane of FIG. 1 taken along line 2—2 thereof illustrating the stacked, superposed elements of FIG. 1.

FIG. 3 is an illustration of a cross-section of the memory plane of FIG. 1 taken along line 3—3 thereof illustrating the stacked, superposed elements of the detector of the present invention.

FIGS. 5a through 5f are schematic illustrations illustrating the generate/detect/replicate operations of the system of FIG. 1 as effected by the signals of the timing diagram of FIG. 4.

DESCRIPTION OF THE PREFERRED EMBODIMENT

Figure 1:
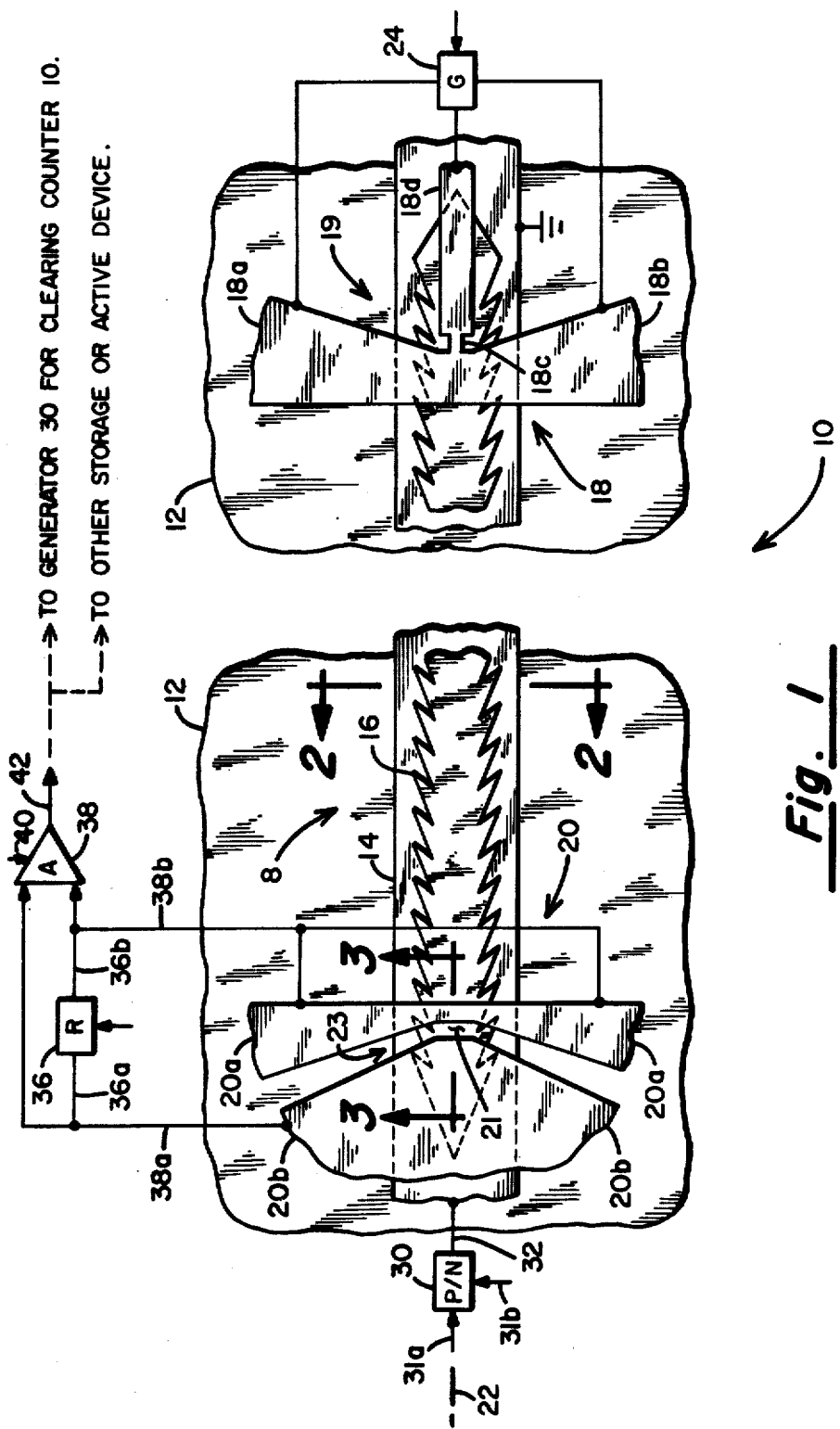
FIG. 1 is a schematic illustration of a portion of a cross-tie wall memory system illustrating, in detail, the counter of the present invention.

With particular reference to FIG. 1, there is presented an illustration of a portion of a cross-tie wall memory system into which the counter of the present invention has been incorporated. With particular reference to FIG. 2 there is presented an illustration of a cross-section of the memory plane of FIG. 1 taken along line 2—2 thereof for the purpose of illustrating the stacked, superposed elements of FIG. 1.

Counter 10 of FIG. 1 includes a non-magnetizable, e.g., glass or silicon, substrate member 12 having the following active members arranged in a stacked, superposed integral assembly: conductive, e.g., gold, straight-edged stripline 14; magnetizable, e.g., NiFe, serrated-edged data track 16; and conductive, e.g., gold, generator 18 and detector 20. Not illustrated in FIG. 1, but illustrated in FIG. 2, are: a thin layer of, e.g., chromium, that may be affixed to the top and/or the bottom surfaces of the metallic layers for ensuring an integral assembly of the metallic layers with the adjacent metallic or insulating layers; and, a thin, smoothing and insulating layer of, e.g., SiO, between the current-conducting stripline 14 and NiFe data track 16. Still further, but not illustrated in either FIG. 1 or 2, superposed this entire assembly and affixed to the top surface thereof, there may be provided an additional, e.g., SiO sealing and insulating layer.

With respect to substrate 12 and stripline 14, such configurations may be similar to that of the D. S. Lo, et al, U.S. Pat. No. 3,906,466. Additionally, with respect to data track 16, it may be configured in the manner as taught by the L. J. Schwee, U.S. Pat. No. 3,868,660 and in the publication "Cross-tie Memories Simplified by the Use of Serrated Strips," L. J. Schwee, et al, AIP Conference Proceedings, No. 29, 21st Annual Conference on Magnetism and Magnetic Materials, 1975, published April, 1976, pages 624–625; or in the manner as taught by the L. H. Johnson, et al, U.S. Pat. No. 4,075,612. With respect to the particular configuration or embodiment of data track 16, it is preferably configured into a film strip whose two opposing edges are formed into mirror-imaged, repetitive patterns of successive narrow portions that form wide portions therebetween in which the cross-tie, Bloch-line pairs are structured.

As is well known, such data track when effected by the proper drive field establishes a cross-tie wall along its geometric centerline which is substantially aligned with its longitudinal axis, identified as line 22 of FIG. 1. Preferably the film strip is isotropic, e.g., has substantially zero magnetic field induced anisotropy, and utilizes its shape, i.e., its edge contour, to constrain the cross-tie wall within the planar contour of and along the longitudinal axis 22.

With particular reference to FIG. 2, there is presented a cross-sectional view of the superposed substrate 12, stripline 14, and data track 16 of FIG. 1 taken along line 2—2 thereof for the purpose of illustrating the configuration of the stacked, superposed elements thereof. FIG. 2 illustrates that the stacked; superposed relationship includes the following listed successive layers:

glass substrate 12—0.50 mm thick;
chromium adhesive layer—100 Å thick;
gold stripline 14—1500 Å thick;
chromium adhesive layer—100 Å thick;
SiO insulative layer 24—12,500 Å thick;
NiFe data track 16—approximately 81% Ni-19% Fe, 350 Å thick.

With particular reference to FIG. 3, there is presented a cross-sectional view of the detector 20 of the present invention taken along line 3—3 of FIG. 1. This cross-sectional view of detector 20 of FIG. 1 is taken for the exclusive purpose of illustrating the manner in which the read current drive signal 33, when coupled thereto by read current drive signal generator 36, is coupled to electrically conductive elements 20a, 20b through data track 16 in the area of gap 21. Accordingly, only elements of the cross-tie wall memory system of FIG. 1 that are affected by this flow of read current drive signal 33 are illustrated in FIG. 3 for the purpose of simplifying the illustration of the operation thereof.

In FIG. 3 there is illustrated the serrated-edged data track 16 upon which are integrally formed the conductive elements 20a, 20b of detector 20 that are positioned along the cross-tie wall in the serrated-edged data track 16 for forming the gap 21 therebetween. The drive current signal 33 is caused to flow from conductive element 20a, in the area of gap 21, down into the associated area of the serrated-edged data track 16 and back into the conductive element 20b.

FIG. 3 illustrates the magnetic state of data track 16 in the area of detector 20 when a cross-tie, Bloch-line pair has been propagated into detector 20 with the cross-tie 44, Bloch-line 45 pair having the downwardly directed, upwardly directed, respectively, magnetizations M as ilustrated in FIG. 3. Additionally illustrated is the manner in which the magnetizations M are oriented along the cross-tie wall in data track 16 as represented by the circles enclosing a dot or a cross indicating the direction of magnetization being directed out of or into, respectively, the plane of the drawing while the magnetizations M within the cross-tie, Bloch-line pair are represented by the downwardly directed, upwardly directed, respectively, arrows indicated within cross-tie 44 and Bloch-line 45, respectively. Note that the circle 46 enclosing a cross indicates the inverted Néel wall section typical of the magnetization M orientation between a cross-tie and a Bloch-line pair.

With reference back to FIG. 1, there is illustrated a shift register 8, comprised of straight-edged stripline 14 and serrated-edged data track 16. Shift register 8 is terminated at one end by generator 18 comprised of conductive elements 18a, 18b, extending transversely away from the longitudinal axis 22, followed by a narrow portion 18c, in which the cross-tie of the cross-tie, Bloch-line pair is generated in generator memory cell 19, and a wide end portion 18d. Shift register 8 is terminated on the other end by detector 20 that is comprised of conductive elements 20a, 20b, each of which forms one of the pair of electrodes across the separation or gap 21 therebetween, in which the presence or absence of the cross-tie in detector memory cell 23 is detected.

In this illustrated embodiment, the conductive elements of generator 18 and detector 20 are formed during the same, e.g., vacuum deposition step of the same material and of the same thickness. This method of forming the generator and the detector elements in one layer during the same process step greatly simplifies the fabrication of a complete cross-tie wall memory system. Additionally, the memory plane of the cross-tie wall memory system of FIG. 1 is symmetrical about its longitudinal axis or centerline 22 whereby current paths are symmetrical providing symmetry of the so-generated drive fields.

With particular reference to FIG. 4 and FIGS. 5a through 5f, there are presented illustrations of a timing diagram and the resultant generation, propagation and detection of cross-tie, Bloch-line pairs in the counter of the cross-tie wall memory system of FIG. 1. In the method of the present invention, the cross-tie wall in data track 16 is initially formed along the geometric centerline 22 of data track 16 by an in-plane field that is directed normal to the longitudinal axis of the data track. The serrated edges of the data track, when the in-plane field is removed, cause the magnetization M within the data track to collapse forming two anti-parallel magnetic domains on opposite sides of the cross-tie wall. The pattern of the serrated edges of data track 16 establishes memory cells along the data track at every consecutive serrated edge portion. Thus, in the operation of the counter of the present invention, a memory cell, defined by the length of one serrated edge along the data track is formed by each consecutive serrated edge with the cross-tie structured between the narrow portions of data track 16 and the associated Bloch-line being structured between the cross-tie and the next adjacent downstream narrow section of data track 16. Note that in the operation of the counter 10 of the present invention, a cross-tie ("1") is selectively generated by generator 18 in generator memory cell 19. This initializes the counter 10 in preparation for the receipt of count pulses on line 31a; until the generation of the cross-tie in generator memory cell 19, the receipt of count pulses on line 31a has no effect upon counter 10. Once counter 10 has been initialized, N counts will propagate the cross-tie in the generator memory cell 19, through the N-1 memory cells between generator memory cell 19 and detector memory cell 23 in detector gap 21 and into the N'th detector memory cell 23.

Initially, a cross-tie, Bloch-line pair is established in a first memory cell defined by the length of one serrated edge along the data track 16 in which the cross-tie is oriented between the narrow width 18c or in generator memory cell 19 of generator 18 and the associated Bloch-line is oriented between the two adjacent narrow portions and on the downstream side of the associated cross-tie. Next, a drive field separates the Bloch-line from the associated cross-tie, "pushing" the Bloch-line downstream into the next adjacent downstream memory cell leaving the associated cross-tie in its initial position. Next, a nucleate drive field generates a cross-tie, Bloch-line pair between the separated cross-tie and Bloch-line. This replicate sequence of push-nucleate cycles is repeated a sufficient number of times until all the memory cells along data track 16 are filled with the last or N'th cross-tie being replicated or resident in detector memory cell 23 in the gap 21 of the detector 20. A readout sequence detects the presence of the cross-tie in the detector gap 21 providing a readout signal indicating that the data track of the counter has been filled indicative of a count of N. Accordingly, in this embodiment each consecutive downstream narrow-wide segment of serrated data track 16 defines a memory cell, N of which determine the count capacity of the counter 10.

Figure 4:
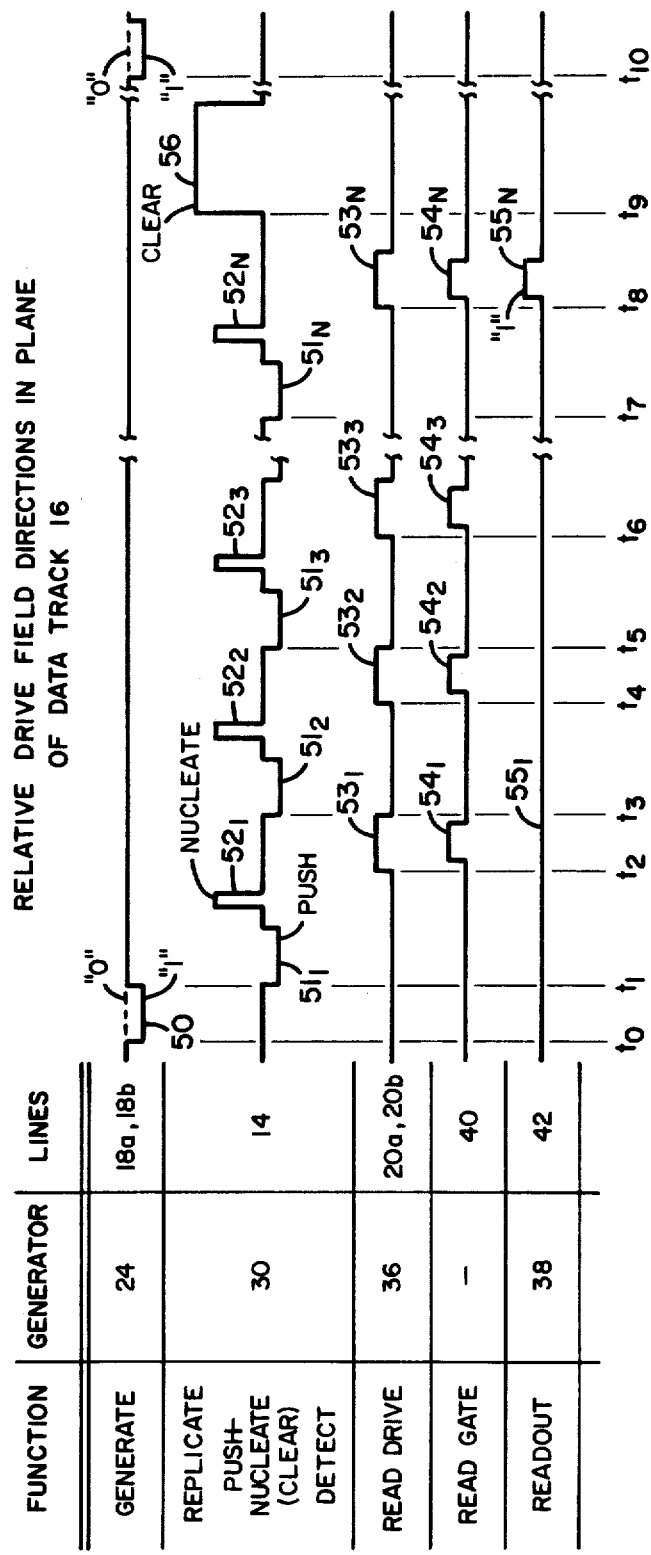
FIG. 4 is an illustration of an illustrative timing diagram for the operation of the cross-tie wall memory system of FIG. 1.

With respect to the timing diagram of FIG. 4, assume that prior to a time $t_0$ generator 18 of FIG. 1 is empty or cleared having no cross-tie, Bloch-line pair established therein. This is as indicated in FIG. 5a. In this situation, in-coming counts on line 31a which trigger the replication pulse sequence will have no effect upon the counter 10. Now, at a time $t_0$, generator 24, via conductive elements 18a, 18b, selectively couples a Generate current signal 50 to generator 18 generating a cross-tie 60, Bloch-line 62 pair in the generator memory cell 19 of generator 18, thus initializing the counter 10 so as to be receptive to in-coming counts on line 31a. This is as illustrated in FIG. 5b.

Figure 5C:
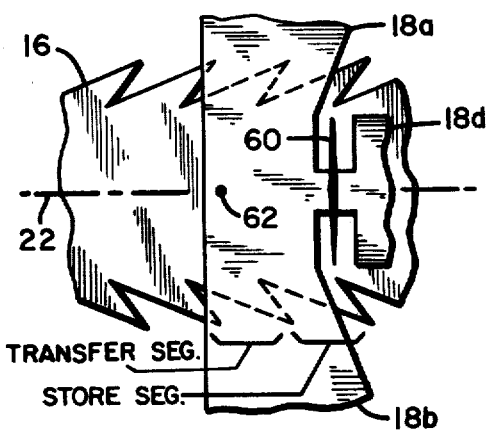
Figure 5D:
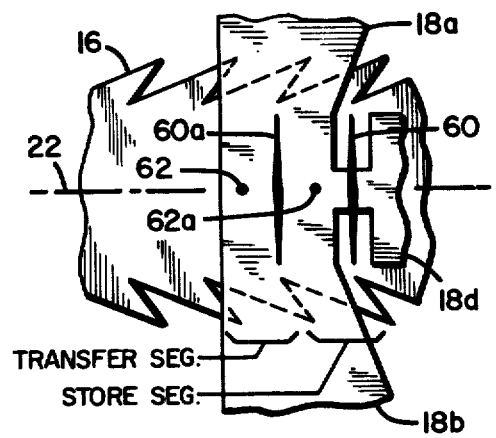

Next, at time $t_1$ with the Generate current signal 50 terminated, an in-coming count signal on line 31a triggers the push-nucleate pulse sequence as follows: Generator 30, via line 32, couples a first polarity "push" current signal $51_1$, to strip-line 14 via line 32, which Push current signal $51_1$ pushes the Bloch-line 62 generated at time $t_0$ into the next adjacent downstream memory cell leaving the associated cross-tie 60 in its original generator memory cell 19. This is as illustrated in FIG. 5c. Next, as the second phase of the replicate current signal, generator 30 couples to stripline 14 via line 32 a second polarity, opposite to that of the first polarity of the Push current signal $51_1$, Nucleate current signal $52_1$, which Nucleate current signal $52_1$ generates a new cross-tie 60a, Bloch-line 62a pair between the separated Bloch-line 62 and cross-tie 60 separated by the Push current signal $51_1$. This is as illustrated in FIG. 5d. Next, at time $t_2$, read driver 36 couples a unipolar Read drive current signal $53_1$ to conductive elements 20a and 20b of detector 20 via lines 36a, 38a and 36b, 38b. Concurrent with the coupling of the Read drive current signal $53_1$ by generator 36 to detector 20, a Read Gate signal $54_1$ is coupled to differential sense amplifier 38 via line 40 whereby a Readout signal is provided at line 42 indicative of the presence vel non of a cross-tie within gap 21 of detector 20. As at this time no cross-tie is present in gap 21 of detector 20 an insignificant amplitude signal $55_1$ is coupled to line 42 by differential sense amplifier 38.

Figure 5E:
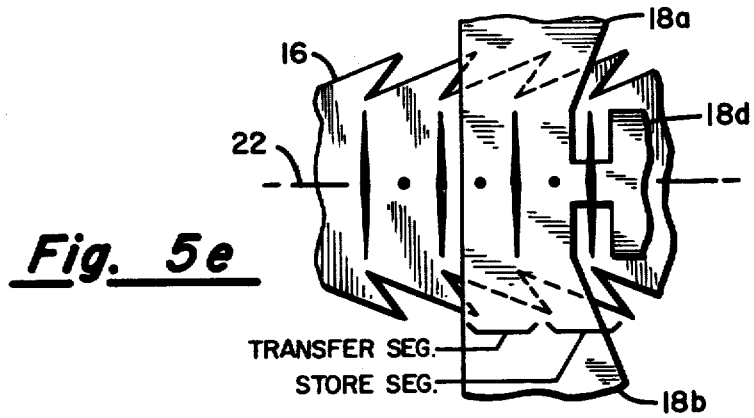
Figure 5F:
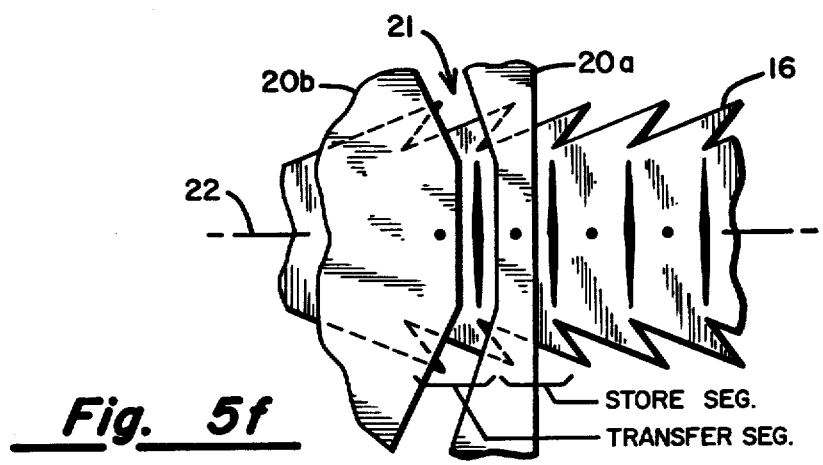

These replicate-detect sequences continue for a plurality of sequences each of which is triggered by an in-coming count pulse, on line 31a filling data track 16 with a plurality of cross-tie, Bloch-line pairs. This is as illustrated in FIG. 5e. These replicate detect sequences continue for N sequences until a cross-tie is replicated in detector memory cell 23 in gap 21 of detector 20. This is as illustrated in FIG. 5f. At this time, the associated Read drive current signal $53_N$ coupled to conductive electrodes 20a and 20b of detector 20 produces, on output line 42, a significant amplitude output signal $50_N$ indicative of the presence of a cross-tie within gap 21 of detector 20.

Subsequent to the detection of the cross-tie within gap 21 of detector 20 indicating that the counter 10 has completed its count of N, signal $55_N$, via line 31b, enables generator 30 to couple, via line 31b, a second polarity Clear current signal 56 to stripline 14 via line 32 whereby all the cross-tie, Bloch-line pairs previously generated and replicated within data track 16 are annihilated, emptying or clearing counter 10 in preparation for the next subsequent Generate current signal 50 from generator 24 as at time $t_{10}$.

What is claimed is:

1. A counter for a cross-tie wall memory system, comprising:

stripline means;

data track means superposed said stripline means forming successive wide and narrow portions along its length;

generator means at a first narrow portion of said data track means for selectively generating a cross-tie at said first narrow portion of said data track means;

detector means at a second narrow portion of said data track means forming a gap that is centered about said second narrow portion of said data track means, said generator means and said detector means sandwiching N narrow portions of said data track means therebetween;

replicator means coupling replicate drive fields to said data track means for replicating said selectively generated cross-tie in said generator means through said data track means and into said detector means gap;

readout means coupling a read drive field across said detector means gap for detecting the presence or absence of a cross-tie in said detector means gap and generating a corresponding Output signal indicating the presence or absence of a cross-tie, in said detector means gap; and, means responsive to said Output signal for coupling a Clear drive field to said data track means for annihilating all of the cross-ties replicated in said data track means and generating a signal indicating that N successive ones of said nucleate drive fields have occurred since the generation of said selectively generated cross-tie in said generator means gap.

2. A counter for a cross-tie wall memory system, comprising:

a straight-edged electrically conductive stripline means;

magnetic data track means insulatively superposed said stripline means for forming successive memory cells therealong;

generator means including an electrically conductive layer that is superposed a generator memory cell in said data track means at a first end thereof for selectively generating a cross-tie in said generator memory cell;

detector means including two electrically conductive lines that are superposed a detector memory cell in said data track menas at a second end thereof for forming a gap therebetween that is centered about said detector memory cell, said generator means and said detector means sandwiching N-1 memory cells therebetween;

replicator means coupling successive replicate drive field sequences to said data track means for replicating said selectively generated cross-tie in said generator memory cell, through said data track means and into said detector memory cell;

read out means coupling a read drive current signal across said detector memory cell for detecting the presence or absence of a cross-tie in said detector memory cell and generating a corresponding Output signal indicating the presence or absence of a cross-tie in said detector memory cell; and, means responsive to said Output signal for coupling a Clear drive field to said data track means for annihilating all of the cross-ties replicated in said data track means and generating a signal indicating that N successive ones of said replicate drive field sequences have occurred since the generation of said selectively generated cross-tie in said generator memory cell.

3. A counter for a cross-tie wall memory system, comprising:

electrically conductive stripline means;

magnetic data track means insulatively superposed said stripline means whose two opposing edges are formed into repetitive patterns of successive wide and narrow portions;

generator means including an electrically conductive layer superposed said data track means at a first end thereof for selectively generating a cross-tie at a narrow portion of said data track means;

detector means including two electrically conductive lines that are electrically conductively affixed to said data track means at a second end thereof for forming a gap therebetween that is centered about one of the narrow portions of said data track means, said generator means and said detector means sandwiching N-1 narrow portions of said data track means therebetween;

replicator means coupling first and second and opposite polarity Push-Nucleate pulse drive field sequences to said data track means for replicating said selectively generated cross-tie in said generator means through said data track means and into said detector means gap;

read out means coupling a read drive current signal across said detector means gap for detecting the presence or absence of a cross-tie in said detector means gap and generating a corresponding Output signal indicating the presence or absence of a cross-tie in said detector means gap; and, means responsive to said Output signal for coupling a Clear drive field to said data track means for annihilating all of the cross-ties replicated in said data track means and generating a signal indicating that N successive ones of said Push-Nucleate pulse drive field sequences have occurred since the generation of said selectively generated cross-tie in said generator means.

4. A counter for a cross-tie wall memory system, comprising:

a straight-edged electrically conductive stripline means;

magnetic serrated-edged data track means insulatively superposed said stripline means for forming successive wide and narrow portions by successive serrations;

generator means including an electrically conductive layer electrically conductively affixed to said data track means at a first end thereof for selectively generating a cross-tie at a narrow portion of said data track means;

detector means including two electrically conductive layers that are electrically conductively affixed to said data track means at a second end thereof for forming a gap therebetween that is centered about one of the narrow portions of said data track means, said generator means and said detector means sandwiching N-1 narrow portions of said data track means therebetween;

replicator means coupling first and second and opposite polarity Push-Nucleate pulse drive field sequences to said data track means for replicating said selectively generated cross-tie in said generator means through said data track means and into said detector means gap;

read out means coupling a read drive field across said detector means gap for detecting the presence or absence of a cross-tie in said detector means gap and generating a corresponding Output signal indicating the presence or absence of a cross-tie in said detector means gap; and, means responsive to said Output signal for coupling a Clear drive field to said data track means for annihilating all of the cross-ties replicated in said data track means and generating a signal indicating that N successive ones of said Push-Nucleate pulse drive field sequences have occurred since the generation of said selectively generated cross-tie in said generator means.

* * * * *